US007962839B1

(12) United States Patent
Wu

(10) Patent No.: US 7,962,839 B1
(45) Date of Patent: Jun. 14, 2011

(54) SINGLE BURST ERROR CORRECTION

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1112 days.

(21) Appl. No.: 11/714,089

(22) Filed: Feb. 27, 2007

(51) Int. Cl.
*H03M 13/00* (2006.01)
(52) U.S. Cl. .................. 714/785; 714/762; 714/784
(58) Field of Classification Search .................. 714/785, 714/762, 784, 787, 752, 788
See application file for complete search history.

(56) References Cited

U.S. PATENT DOCUMENTS

| 4,291,406 A | * | 9/1981 | Bahl et al. ............... 714/787 |
| 4,916,702 A | | 4/1990 | Berlekamp |
| 5,936,978 A | * | 8/1999 | Ramesh et al. ............... 714/762 |
| 6,449,746 B1 | | 9/2002 | Truong et al. |
| 7,721,186 B2 | * | 5/2010 | Bates et al. ............... 714/784 |

OTHER PUBLICATIONS

Yin et al., Burst-Error-Correcting Algorithm for Reed-Solomon Codes, Electronics Letters, May 24, 2001, vol. 37, No. 11, pp. 695-697.
Dawson et al., Burst-Error Correcting Algorithm for Reed-Solomon Codes, Electronics Letters, May 25, 1995, vol. 31, No. 11, pp. 848-849.
Chen et al., A Burst-Error-Correcting Algorithm for Reed-Solomon Codes, IEEE Transactions on Information Theory, vol. 38, No. 6, Nov. 1992, pp. 1807-1809.

* cited by examiner

*Primary Examiner* — Fritz Alphonse
(74) *Attorney, Agent, or Firm* — Van Pelt, Yi & James LLP

(57) ABSTRACT

Identifying a burst error is disclosed. Identifying includes computing a syndrome check polynomial corresponding to a burst of length up to $2t-1$ in received data and identifying a shortest burst based on the longest consecutive root sequence of the syndrome check polynomial. The received data is corrected based at least in part on the shortest burst.

25 Claims, 3 Drawing Sheets

SINGLE BURST ERROR CORRECTION

BACKGROUND OF THE INVENTION

Reed-Solomon codes may be used to correct burst errors, unlike other decoding methods that often assume that the occurrence of a symbol error is independent of that of others, and in which burst errors are treated the same as random errors in the decoding procedure. A Reed-Solomon code of length n and dimension k is capable of correcting up to $$t \triangleq \left\lfloor \frac{n-k}{2} \right\rfloor$$

errors. A single burst of length up to n−k−1 can be identified, with certain miscorrection probability. However, current approaches to single burst error correction are time consuming and not hardware amenable, requiring cubic computational complexity due to trial and error computations. Improved techniques for single burst error correction would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
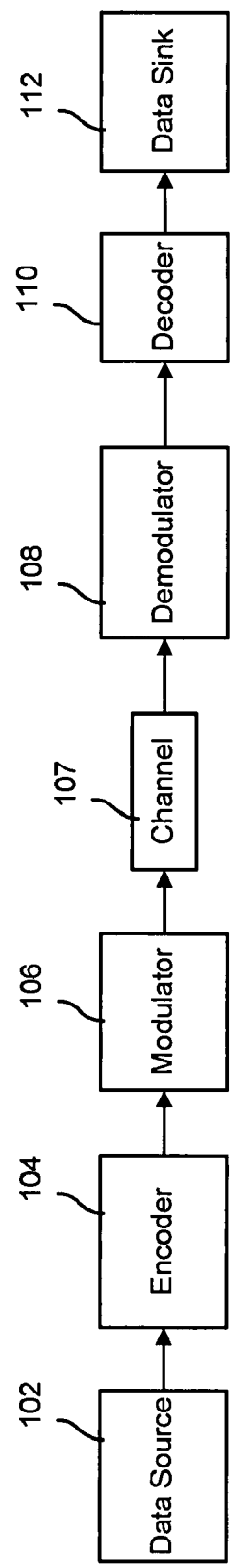
FIG. 1 is a block diagram illustrating an embodiment of a system for communicating or storing data.

FIG. 1 is a block diagram illustrating an embodiment of a system for communicating or storing data. In the example shown, data source 102 provides source data to encoder 104, which encodes the source data, for example, using Reed Solomon encoding. Encoder 104 provides the encoded source data to modulator 106. In the case of a data storage system, modulator 106 modulates the encoded source data and writes it to a storage medium, such as a disk. In the case of a communication system, modulator 106 modulates the encoded source data and transmits it over a transmission medium, such as over the air in the case of a wireless transmission. Channel 107 is, for example, a storage medium or a transmission medium. Demodulator 108 receives and demodulates the received data. In the case of a data storage system, demodulator 108 reads the data from a data storage medium. In the case of a communication system, demodulator 108 receives the received data using an appropriate receiver, such as an antenna. The demodulated data is input to decoder 110, which decodes or corrects the data, for example using a Reed Solomon decoder. The decoded data is provided to data sink 112. Data sink 112 is the recipient of the data, such as a computer. Although erasures may be described in the examples herein, the techniques described herein are equally applicable to other types of errors besides erasures.

In some embodiments, a one-pass method is used to correct a single burst up to length 2t−1 for Reed-Solomon codes, having a random error correction capability t. A burst error, as used herein, refers to a sequence of consecutive data symbols, one or more of which may contain errors, for example, caused by scratches, dust, or other physical defects on a disk. Note that it is not necessary for all symbols in a burst to be erroneous, i.e., a burst might be inconsecutive. In some embodiments, a Chien search is used to determine all single-bursts, and moreover, to identify the shortest one by tracking the longest consecutive roots. In some embodiments, its VLSI implementation is virtually the same as that of error-and-erasure decoding. The method is also resilient to interleaving, with minor modifications. In some embodiments, the method is performed by decoder 110.

Reed-Solomon codes may be used to correct burst errors, whereas other decoding methods often assume that the occurrence of a symbol error is independent of that of others, and burst errors are treated the same as random errors in the decoding procedure. A Reed-Solomon code of length n and dimension k is capable of correcting up to $$t \triangleq \left\lfloor \frac{n-k}{2} \right\rfloor$$

errors. However, a single burst of length up to n−k−1 can be efficiently identified, with certain miscorrection probability. In U.S. Pat. No. 4,916,702, the single burst is trapped by a re-encoder shift register. In "A burst-error-correcting algorithm for Reed-Solomon codes," (IEEE Trans. Inform. Theory, vol. 38, pp. 1807-1812, November 1992), Chen and Owsley showed a method to utilize syndromes to determine all single-bursts. It is theoretically straightforward but computationally costly (due to solving irregular linear equation system). In "Burst error-correcting algorithm for Reed-Solomon codes," (Electronics Letters, vol. 31, pp. 848-849, 1995), Dawson and Khodkar observed that the complicated equation system in the Chen and Owsley paper can be obtained alternatively from the well-known key equation, and presented a simplified method to determine all single-bursts. Nevertheless, the method still performs trial and error for all possible burst lengths. In "Burst-error-correcting algorithm for Reed-Solomon codes," (Electronics Letters, vol. 37, pp. 695-697, 2001), Yin, et. al. presented a cyclic shift method, as in U.S. Pat. No. 4,916,702. The former uses Forney full erasure method, whereas the latter employs re-encoding method. The methods described in this paragraph require cubic computational complexity.

Disclosed herein is a decoding method that requires only quadratic computational complexity and moreover is hardware amenable. More specifically, what is shown is that the determination of all candidate single-bursts, and the desired shortest single-burst, can be obtained by performing a one-run Chien search. In particular, it effectively gets rid of a trial and error computation on burst length. Its VLSI implementation can be derived from an error-and-erasure decoding architecture with minor modifications, rendering it very attractive for on-the-fly, real time, or near real time applications due to short delay.

Reed-Solomon Codes

For a Reed-Solomon C(n,k) code over $GF(2^m)$, a k-symbol dataword $D \triangleq [D_{k-1}, D_{k-2}, \ldots, D_1, D_0]$ is encoded to an n-symbol codeword $C \triangleq [C_{n-1}, C_{n-2}, \ldots, C_1, C_0]$, or more conveniently, a dataword polynomial $D(x) = D_{k-1}x^{k-1} + D_{k-2}x^{k-2} + \ldots + D_1 x^1 + D_0$ is encoded to a codeword polynomial $C(x) = C_{n-1}x^{n-1} + C_{n-2}x^{n-2} + \ldots + C_1 x + C_0$, by means of a generator polynomial $$G(x) \triangleq \prod_{i=1}^{n-k} (x - \alpha^i),$$

where $\alpha$ is a primitive element of $GF(2^m)$. A polynomial of degree less than n is a codeword polynomial if and only if it is divisible by the generator polynomial $G(x)$. As can be readily seen, a codeword polynomial $C(x)$ satisfies $$C(\alpha^i) = 0, i = 1, 2, \ldots, n-k.$$

The minimum Hamming distance of the code is $d_{min} = n - k + 1$, a feature known as maximally-distance-separable. For convenience, let $n-k=2t$, where t is known as the error-correction capability.

A systematic encoding generates a codeword that is comprised of the dataword followed by parity-check symbols. This can be obtained as follows. Let $\Psi(x) \triangleq \Psi_{2t-1}x^{2t-1} + \Psi_{2t-2}x^{2t-2} + \ldots + \Psi_1 x + \Psi_0$ denote the remainder that $x^{2t}D(x)$ is divided by $G(x)$. Then, the polynomial $x^{2t}D(x) - \Psi(x)$ is a multiple of $G(x)$ and is denoted as a systematic codeword polynomial; alternatively, $C = [D_{k-1}, D_{k-2}, \ldots, D_0, -\Psi_{2t-1}, -\Psi_{2t-2}, \ldots, -\Psi_0]$.

Let $C(x)$ denote the transmitted codeword polynomial and $R(x)$ the received word polynomial after appropriate channel quantization. The decoding objective is to determine the error polynomial $E(x)$ such that $C(x) = R(x) - E(x)$. Next the Berlekamp-Massey method is introduced. It begins with the computation of syndromes defined as follows:

$$S_i = R(\alpha^{i+1}) = C(\alpha^{i+1}) + E(\alpha^{i+1}) = E(\alpha^{i+1}),$$
$$i = 0, 1, 2, \ldots, 2t-1.$$

If all 2t syndrome values are zero, then $R(x)$ is a codeword and thus is presumed that $C(x) = R(x)$, i.e., no errors have occurred. Otherwise, let e denote the (unknown) number of errors, $X_1, X_2, \ldots, X_e$ denote the error locations, and $Y_1, Y_2, \ldots, Y_e$ denote the corresponding error magnitudes. The syndrome polynomial is defined as $$S(x) \triangleq S_0 + S_1 x + S_2 x^2 + \ldots + S_{2t-1} x^{2t-1}.$$

The error locator polynomial is defined as $$\Lambda(x) \triangleq \prod_{i=1}^{e} (1 - X_i x) = 1 + \Lambda_1 x + \Lambda_2 x^2 + \ldots + \Lambda_e x^e. \quad (2)$$

The error evaluator polynomial is defined as $$\Omega(x) \triangleq \sum_{i=1}^{e} Y_i X_i \sum_{j=1, j \neq i}^{e} (1 - X_j x) = \Omega_0 + \Omega_1 x + \Omega_2 x^2 + \ldots + \Omega_{e-1} x^{e-1}. \quad (3)$$

The three polynomials satisfy the following key equation $$\Omega(x) = \Lambda(x) S(x) \pmod{x^{2t}}. \quad (4)$$

Single-Burst Decoding Method

Errors are a single burst if their locations are within an interval of $2t-1$. A length of $2t$ carries no meaning, as there always exists a solution for any given location via pure erasure decoding. The length of a burst is defined as the length between the largest erroneous position and the smallest erroneous position. Note that it is not necessary for all symbols in the burst interval to be erroneous, i.e., a burst might be inconsecutive.

The following lemma results from the key equation (4).

Lemma 1 Let $\alpha^{-r}$ be the beginning location of a single burst. The burst length is f if and only if $$\begin{cases} S_f \Lambda_0 + S_{f-1} \Lambda_1 + \ldots + S_0 \Lambda_f = 0 \\ S_{f+1} \Lambda_0 + S_f \Lambda_1 + \ldots + S_1 \Lambda_f = 0 \\ \quad \vdots \\ S_{2t-1} \Lambda_0 + S_{2t-2} \Lambda_1 + \ldots + S_{2t-1-f} \Lambda_f = 0 \end{cases} \quad (5)$$

where $\Lambda(x) = (1 - \alpha^r x)(1 - \alpha^{r+1} x) \ldots (1 - \alpha^{r+f-1} x)$.

Lemma 2 Let $\alpha^{-r}$ be the beginning location of a single burst with length up to $2t-1$. Then $$S_{2t-1} \Lambda_0 + S_{2t-2} \Lambda_1 + \ldots + S_0 \Lambda_{2t-1} = 0 \quad (6)$$

regardless of the actual length of the burst, where $$\Lambda(x) = (1 - \alpha^r x)(1 - \alpha^{r+1} x) \ldots (1 - \alpha^{r+2t-2} x).$$

Proof: It is true for a burst of length $2t-1$. When the length is less than $2t-1$, it can always be enlarged to a burst of length $2t-1$ by including a number of subsequent error-free symbols. The following theorem efficiently determines a burst length. Its proof follows from Lemma 2.

Theorem 1 Let $\alpha^{-r}$ be the beginning location of a single burst. The burst length is f if and only if $$\begin{cases} S_{2t-1} \Lambda_0^{(0)} + S_{2t-2} \Lambda_1^{(0)} + \ldots + S_0 \Lambda_{2t-1}^{(0)} = 0 \\ S_{2t-1} \Lambda_0^{(1)} + S_{2t-2} \Lambda_1^{(1)} + \ldots + S_0 \Lambda_{2t-1}^{(1)} = 0 \\ \quad \vdots \\ S_{2t-1} \Lambda_0^{(2t-1-f)} + S_{2t-2} \Lambda_1^{(2t-1-f)} + \ldots + S_0 \Lambda_{2t-1}^{(2t-1-f)} = 0 \end{cases} \quad (7)$$

where $$\Lambda^{(i)}(x) = (1 - \alpha^{r-i} x)(1 - \alpha^{r-i+1} x) \ldots (1 - \alpha^{r-i+2t-2} x).$$

If it is defined that $$\Lambda^*(x) = (1-\alpha^{-(t-1)}x)(1-\alpha^{-(t-2)}x)\ldots(1-\alpha^{t-1}x) \quad (8)$$

and $$\Gamma(x) = \sum_{i=0}^{2t-1} S_{2t-1-i} \Lambda_i^* \cdot x^i \quad (9)$$

where $\Lambda_i^*$ is the i-th term of $\Lambda^*(x)$

Then, the above theorem can be interpreted as

Corollary 1 A burst occurs at position $\alpha^{-r}$ with length f, if and only if $\Gamma(x)$ has consecutive roots $\alpha^{t+r-f}, \alpha^{t+r-f+1}, \ldots, \alpha^{t+r-1}$.

$\Gamma(x)$ is referred to as the syndrome check polynomial. Note $\Gamma(x)$ has degree 2t–1 and thus may have up to 2t–1 valid roots, that is, there are 2t–1 candidate single-bursts in the worst case. The objective is to determine the shortest one.

Thus, there is a relationship between the burst length and the number of consecutive roots of $\Gamma(x)$. Specifically, the longest consecutive root sequence corresponds to the shortest burst length. In various embodiments $\Gamma(x)$ may take other forms. For example, in $\Lambda_i^*(x)$, a constant may be added to each exponent of $\alpha$. $\Lambda_i^*(x)$ may take other forms as long as there are 2t–1 consecutive roots of $\Lambda_i^*(x)$. $\Gamma(x)$ corresponds to 2t–1 consecutive error locations.

Erasure decoding does not need to be performed for every root as in some other methods. Using this method, once the shortest burst is identified, erasure decoding only needs to be performed once.

One way to compute error magnitudes is re-encoding through cyclic shifting of a received word. It is simple but takes a relatively long time. An alternative way, which avoids a long delay, is to use the Forney formula $$Y_i = \frac{\Omega(X_i^{-1})}{\Lambda_{odd}(X_i^{-1})}. \quad (10)$$

where $X_i^{-1}$ denotes a root of $\Lambda(x)$. The beginning position of the burst is denoted by r and the genuine error locator polynomial $\Lambda(x)$ can be computed by $$\Lambda_i = \Lambda_i^* \beta^i, i=1, 2, \ldots, 2t-1$$

where $\beta = \alpha^{r+t-1}$, and the error evaluator polynomial is then computed through (4). $\beta(x)$ is referred to as the starting location indicator.

A single burst correction method is disclosed.

Single Burst Correction

Figure 2:
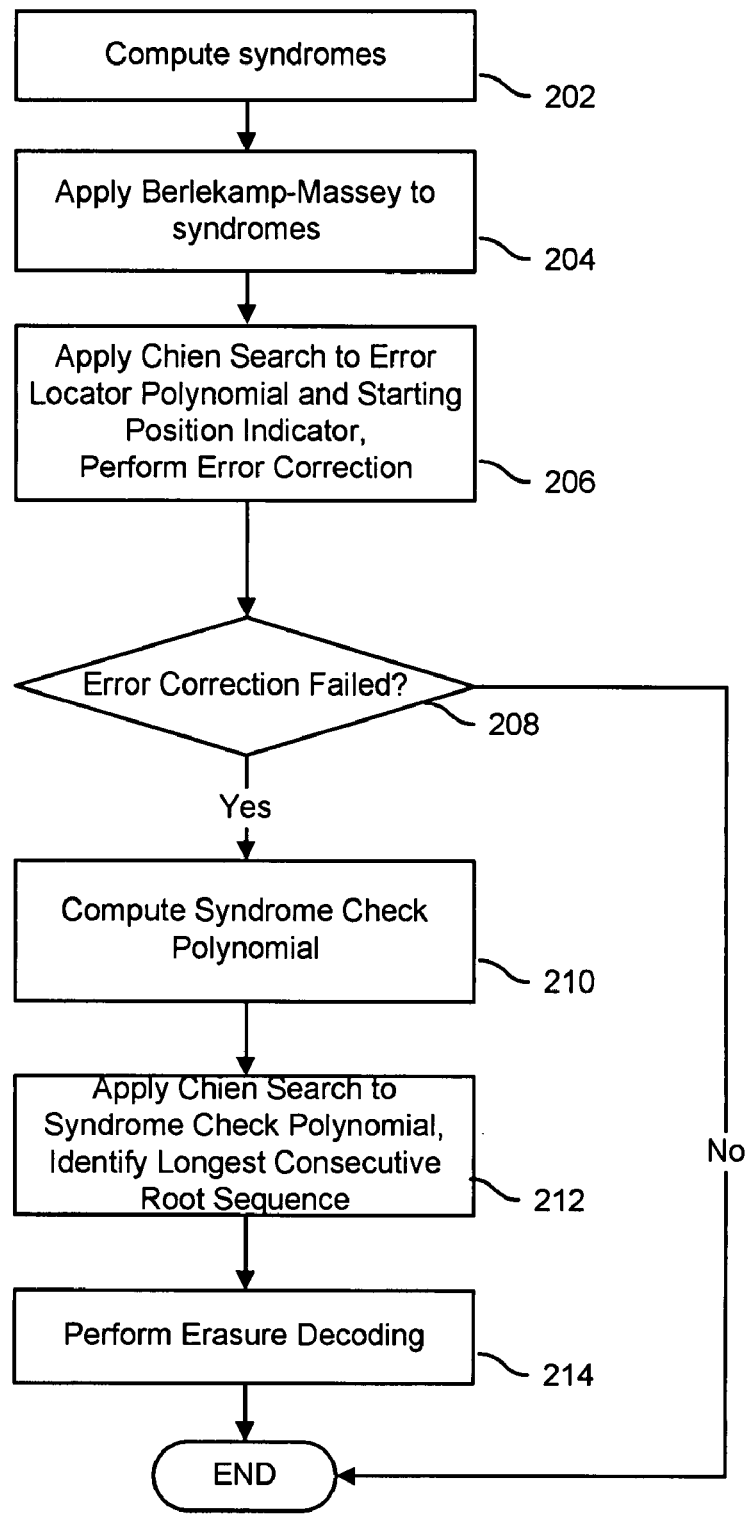
FIG. 2 is a flow chart illustrating an embodiment of a process for decoding a single burst.

FIG. 2 is a flow chart illustrating an embodiment of a process for decoding a single burst. In some embodiments, this process is performed by decoder 110. In some embodiments, the coefficients of $\Lambda^*(x)$ are precomputed. At 202, syndromes $S_0, \ldots, S_{n-k-1}$ are computed, as described above. At 204, the Berlekamp-Massey method is applied to the syndromes. At 206, the Chien search is applied to the error locator polynomial $\Lambda(x)$ and the starting error indicator $\beta(x)$. Error correction is attempted. At 208, it is determined if error correction failed. For example, if the burst length is less than t, then the error(s) can be corrected. If error correction did not fail, the process ends. If error correction did fail, then at 210, the coefficients of the syndrome check polynomial, $\Gamma(x)$ are computed. At 212, the Chien search is used to find the roots of the syndrome check polynomial. The shortest single-burst corresponds to the longest consecutive root sequence. The longest consecutive root sequence is identified. The start burst position associated with the longest consecutive root sequence is identified. At 214, erasure decoding is performed. A variety of erasure decoding techniques may be used. In some embodiments, burst error magnitudes are obtained using a Forney formula, such as equation 10. In some embodiments, cyclic shift and re-encoding are used.

In some embodiments, if the burst length exceeds a particular length, then the result is considered unreliable. For example, if the burst length is >2t–p, where p=5, then the process returns a failure indication after 212.

The method has computational complexity O(dn) and remains applicable with minor modification even when the code is interleaved. Moreover, it has virtually the same VLSI architecture as that of error-and-erasure decoding.

The following is an example:

t=10

The degree of $\Gamma(x)$ is 2t–1.

The roots of $\Gamma(x)$ are: $\alpha^{10}$, $\alpha^{13}$, $\alpha^{15}$ $\alpha^{16}$, and $\alpha^{30}$ $\alpha^{31}$ $\alpha^{32}$.

The roots correspond to the following burst lengths:

| Root | Burst Length f |
|---|---|
| $\alpha^{10}$ | 2t-1 |
| $\alpha^{13}$ | 2t-1 |
| $\alpha^{15}$ $\alpha^{16}$ | 2t-2 |
| $\alpha^{30}$ $\alpha^{31}$ $\alpha^{32}$ | 2t-3 |

The longest consecutive root sequence corresponds to the shortest burst length. The longest consecutive root sequence is $\alpha^{30}$ $\alpha^{31}$ $\alpha^{32}$ and therefore, the shortest burst length is f=2t–3=17 (because t=10). The location of the shortest burst is determined by solving for r in the following equation from Corollary 1:

t+r–f=30

Therefore, r=30–t+f

Because t=10 and f=17, r=37

Therefore, the shortest burst starts at location r=37 and has length f=17. The magnitude of the burst can be obtained using a Forney formula, such as equation 10.

Figure 3:
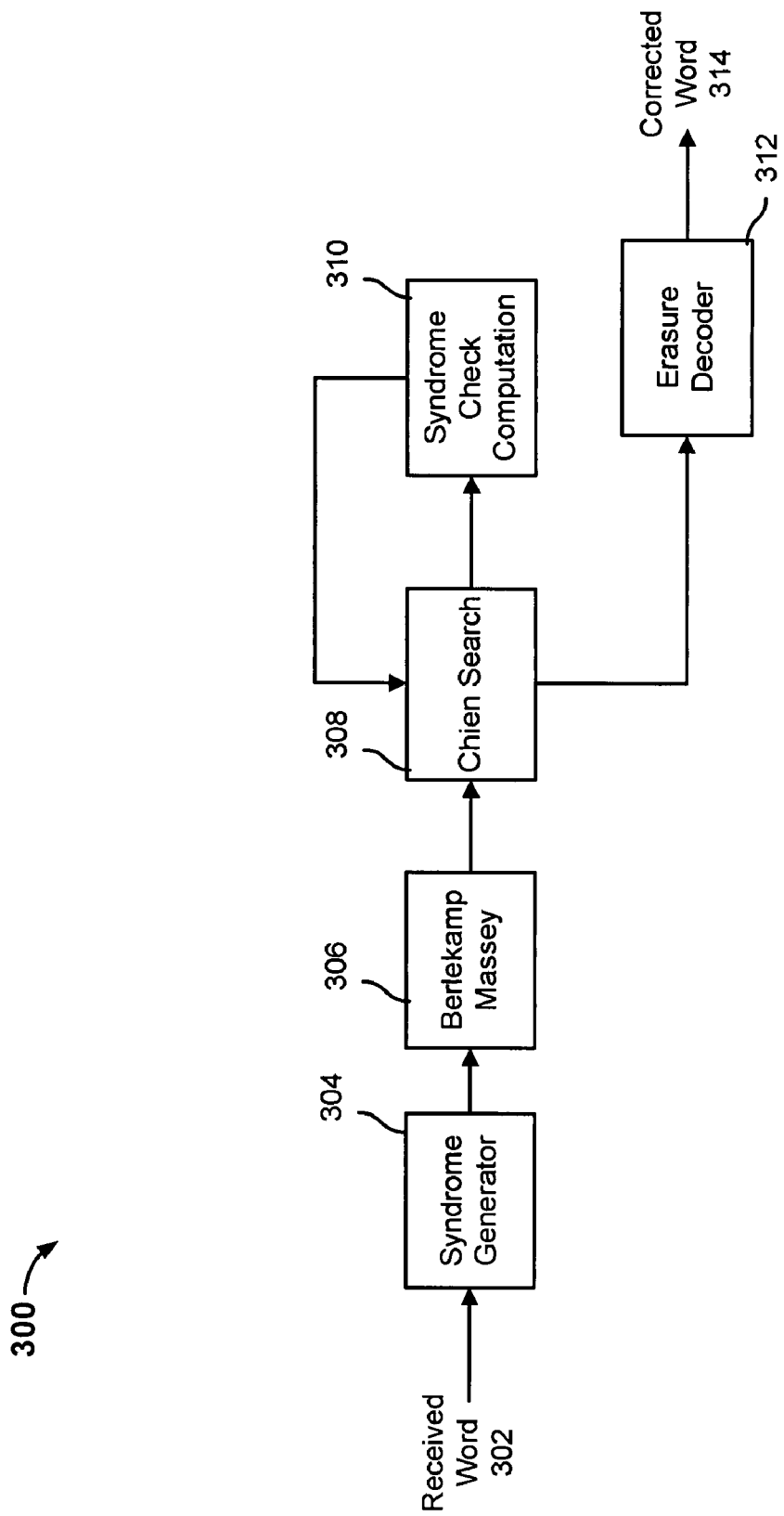
FIG. 3 is a block diagram illustrating an embodiment of a system for decoding a single burst.

FIG. 3 is a block diagram illustrating an embodiment of a system for decoding a single burst. System 300 is an example embodiment of decoder 110 when Reed Solomon coding is used. In some embodiments, system 300 performs the process of FIG. 2.

In the example shown, received word 302 is provided as input to syndrome generator 304, which computes syndromes $S_0, \ldots, S_{n-k-1}$, as described above. The syndromes are input to Berlekamp Massey block 306, which computes an error locator polynomial $\Gamma(x)$ and a starting location indicator $\beta(x)$, as described above. The error locator polynomial and the starting location indicator are input into Chien Search block 308, which attempts to perform a Chien Search and error correction. If the Chien Search fails, then the syndromes and the error locator polynomial are provided to syndrome check block 310, which computes syndrome check polynomial $\Gamma(x)$, as described above. The syndrome check polynomial is provided back to Chien Search block 308. The Chien Search is applied to the syndrome check polynomial. The longest consecutive root sequence is identified and the corresponding starting burst location $\beta(x)$ and length f are provided as input to erasure decoder 312. Erasure decoder 312 outputs corrected word 314. Erasure decoder 312 may use a variety of techniques. In some embodiments, erasure decoder 312 provides the error locator polynomial $\Lambda(x)$ and the error evaluator polynomial $\Omega(x)$ as input to a Forney formula for error correction, such as equation 10. In some embodiments, erasure decoder 312 uses cyclic shift and re-encoding. In this example, Chien Search block 308 is used twice—during an initial Chien Search and a subsequent Chien Search applied to the syndrome check polynomial. In other embodiments, other configurations are possible.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of identifying a burst error using an error-correcting code, comprising:

computing a syndrome check polynomial corresponding to a burst of length up to 2t−1 in received data, wherein the syndrome check polynomial, Γ(x), is defined as $$\Gamma(x) = \sum_{i=0}^{2t-1} S_{2t-1-i} \Lambda_i^* \cdot x^i$$

wherein t is an error-correction capability corresponding to the error-correcting code, S is a syndrome polynomial, and Λ is an error locator polynomial;

identifying a shortest burst based on the longest consecutive root sequence of the syndrome check polynomial, wherein identifying is performed by a decoder; and correcting the received data based at least in part on the shortest burst.

2. The method as recited in claim 1, wherein the roots of the syndrome check polynomial are obtained using a Chien search.

3. The method as recited in claim 1, wherein identifying includes identifying a burst length.

4. The method as recited in claim 1, wherein identifying includes identifying a burst location.

5. The method as recited in claim 1, further including computing a burst magnitude corresponding to the shortest burst.

6. The method as recited in claim 1, further including using a Forney Formula to obtain the magnitudes of the shortest burst.

7. The method as recited in claim 1, further including performing a cyclic shift and re-encoding to obtain the magnitude of the shortest burst.

8. The method as recited in claim 1, wherein the method is performed after an initial Chien search on the error locator polynomial fails.

9. The method as recited in claim 1, further including returning a failure indication if the shortest burst has a length greater than a prescribed length.

10. The method as recited in claim 1, wherein the received data is received from a demodulator that is configured to read stored data from a data storage medium.

11. A computer program product for identifying a burst error using an error-correcting code, the computer program product being embodied in a non-transitory computer readable storage medium and comprising computer instructions for:

computing a syndrome check polynomial corresponding to a burst of length up to 2t−1 in received data, wherein the syndrome check polynomial, Γ(x), is defined as $$\Gamma(x) = \sum_{i=0}^{2t-1} S_{2t-1-i} \Lambda_i^* \cdot x^i$$

wherein t is an error-correction capability corresponding to the error-correcting code, S is a syndrome polynomial, and Λ is an error locator polynomial;

identifying a shortest burst based on the longest consecutive root sequence of the syndrome check polynomial; and correcting the received data based at least in part on the shortest burst.

12. The computer program product as recited in claim 11, wherein the roots of the syndrome check polynomial are obtained using a Chien search.

13. The computer program product as recited in claim 11, wherein identifying includes identifying a burst length.

14. The computer program product as recited in claim 11, wherein identifying includes identifying a burst location.

15. The computer program product as recited in claim 11, the computer program product further comprising computer instructions for computing a burst magnitude corresponding to the shortest burst.

16. A system for identifying a burst error using an error-correcting code, comprising:

a decoder configured to:

compute a syndrome check polynomial corresponding to a burst of length up to 2t−1 in received data, wherein the syndrome check polynomial, Γ(x), is defined as $$\Gamma(x) = \sum_{i=0}^{2t-1} S_{2t-1-i} \Lambda_i^* \cdot x^i$$

wherein t is an error-correction capability corresponding to the error-correcting code, S is a syndrome polynomial, and Λ is an error locator polynomial;

identify a shortest burst based on the longest consecutive root sequence of the syndrome check polynomial; and correct the received data based at least in part on the shortest burst; and an input interface coupled to the decoder.

17. The system as recited in claim 16, wherein the roots of the syndrome check polynomial are obtained using a Chien search.

18. The system as recited in claim 16, wherein the decoder is configured to identify the shortest burst at least in part by identifying a burst length.

19. The system as recited in claim 16, wherein the decoder is configured to identify the shortest burst at least in part by identifying a burst location.

20. The system as recited in claim 16, wherein the decoder is further configured to compute a burst magnitude corresponding to the shortest burst.

21. The system as recited in claim 16, wherein the decoder is further configured to use a Forney Formula to obtain the magnitudes of the shortest burst.

22. The system as recited in claim 16, wherein the decoder is further configured to perform a cyclic shift and re-encoding to obtain the magnitude of the shortest burst.

23. The system as recited in claim 16, wherein the decoder is configured to compute the syndrome check polynomial, identify the shortest burst, and correct the received data after an initial Chien search on the error locator polynomial fails.

24. The system as recited in claim 16, wherein the decoder is further configured to return a failure indication if the shortest burst has a length greater than a prescribed length.

25. The system as recited in claim 16, further including a demodulator coupled to the input interface and configured to read stored data from a data storage medium.

* * * * *